(12) United States Patent
Sato

(10) Patent No.: US 7,804,277 B2
(45) Date of Patent: Sep. 28, 2010

(54) APPARATUS FOR ESTIMATING STATE OF CHARGE OF SECONDARY BATTERY

(75) Inventor: Naoto Sato, Kosai (JP)

(73) Assignee: Panasonic EV Energy Co., Ltd., Kosai-shi (JP)

( * ) Notice: Subject to any disclaimer, the term of this patent is extended or adjusted under 35 U.S.C. 154(b) by 216 days.

(21) Appl. No.: 12/196,147

(22) Filed: Aug. 21, 2008

(65) Prior Publication Data
US 2009/0051321 A1 Feb. 26, 2009

(30) Foreign Application Priority Data
Aug. 24, 2007 (JP) ............................. 2007-217785

(51) Int. Cl.
*H02J 7/00* (2006.01)
(52) U.S. Cl. ....................................... 320/132; 320/149
(58) Field of Classification Search ................. 320/132, 320/149
See application file for complete search history.

(56) References Cited

U.S. PATENT DOCUMENTS

| | | | | |
|---|---|---|---|---|
| 5,949,217 A * | 9/1999 | Okada et al. | ................. | 320/132 |
| 6,232,744 B1 * | 5/2001 | Kawai et al. | ................. | 320/132 |
| 6,608,482 B2 * | 8/2003 | Sakai et al. | ................. | 324/426 |
| 6,646,421 B2 * | 11/2003 | Kimura et al. | ................. | 320/132 |
| 6,700,383 B2 * | 3/2004 | Kimura et al. | ................. | 324/429 |
| 7,085,661 B2 * | 8/2006 | Emori et al. | ................. | 702/63 |
| 7,477,038 B2 * | 1/2009 | Taniguchi | ................. | 320/104 |

FOREIGN PATENT DOCUMENTS

JP 2004-22322 A 1/2004

\* cited by examiner

*Primary Examiner*—Edward Tso
*Assistant Examiner*—Ramy Ramadan
(74) *Attorney, Agent, or Firm*—Christensen O'Connor Johnson Kindness PLLC

(57) ABSTRACT

An apparatus for estimating a state of charge (SOC) of a secondary battery. A control section of a battery controller (ECU) computes a total amount of electric discharge of a secondary battery and compares the total amount of electric discharge with a predetermined threshold value. The threshold value is set so as to fall within a range of; for instance, 400 Ah to 1600 Ah. When the total amount of electric discharge is equal to or greater than the predetermined threshold value, an open-circuit-voltage (OCV)-SOC map is replaced with a map achieved in a state where a memory effect is saturated. When the total amount of electric discharge is smaller than the predetermined threshold value, a correction is made to the map so as to achieve a map that is a mixture consisting of the OCV-SOC map achieved in an initial state and the OCV-SOC map achieved in the saturated state at a predetermined ratio. The SOC is estimated by use of the corrected map.

9 Claims, 10 Drawing Sheets

APPARATUS FOR ESTIMATING STATE OF CHARGE OF SECONDARY BATTERY

PRIORITY INFORMATION

This application claims priority to Japanese Patent Application No. 2007-217785 filed on Aug. 24, 2007, which is incorporated herein by reference in its entirety.

BACKGROUND OF THE INVENTION

1. Technical Field

The present invention relates to a technique for estimating a state of charge of a secondary battery, such as a nickel-metalhydride battery and a lithium ion battery.

2. Related Art

A technique for estimating a state of charge (hereinafter abbreviated as "SOC") of a nickel-metalhydride battery or a lithium ion battery and controlling charging and discharging of the secondary battery on the basis of the estimated SOC has hitherto been known. In particular, a hybrid electric vehicle using a secondary battery as a power source for a drive motor, and the like, performs travel control on the basis of the SOC of the secondary battery and therefore requires highly-accurate estimation of the SOC.

A method for estimating an SOC by measuring an integrated current value input by or output from the secondary battery, a method for estimating an SOC from correlation between a preset open circuit voltage (OCV) and an SOC, a method for estimating an SOC by combination of the methods, and the like, have hitherto been proposed. However, as is well known, electromotive force of the secondary battery fluctuates by reason of a memory effect. Even when an SOC is estimated from the correlation between an OCV and an SOC achieved in an initial state, the accuracy of the thus-estimated SOC deteriorates. For this reason, making a correction to the correlation according to the memory effect has been put forward.

2004-22322 A describes a technique for storing in memory a range of an SOC and a range of OCV where a correction value is applied in response to a memory effect; computing a correction value on the basis of the temperature of a battery and a charge/discharge current; applying the correction value only within the range of the SOC and the range of the OCV stored in memory, to thus prepare an OCV-SOC map; and estimating an SOC from the OCV-SOC map.

FIG. 10 shows an OCV-SOC map achieved in an initial state and after production of a memory effect. In the drawing, a horizontal axis represents an SOC (%), and a vertical axis represents an OCV (V). Correlation was achieved when charge and discharge operations were repeatedly performed in the vicinity of the center level of the SOC. A voltage drop is in a discharge side, and a voltage rise is in a charge side.

However, even when a correction value is computed from the temperature of the battery and the charge/discharge current, performance of accurate correction is not necessarily assured, which raises a problem of a failure to enhance the accuracy of estimation of the SOC.

SUMMARY

The present invention provides an apparatus that enables easy enhancement of estimation accuracy of an SOC.

The present invention is directed toward an apparatus for estimating a state of charge of a secondary battery, comprising:

a storage unit that stores correlation information showing correlation between an open circuit voltage and a state of charge;

a total-amount-of-electric-discharge detection unit that detects a total amount of electric discharge of the secondary battery;

a correction unit that makes a correction to the correlation information in accordance with a relationship between the total amount of electric discharge and a predetermined threshold value; and an estimation unit that estimates a state of charge of the secondary battery by use of the corrected correlation information.

In one embodiment of the present invention, the storage unit stores, as the correlation information, correlation information achieved in an initial state where no memory effect is produced and correlation information achieved in a saturated state where the memory effect is saturated; and the correction unit makes a correction, when the total amount of electric discharge is equal to or greater than the predetermined threshold value, so as to replace the correlation information achieved in the initial state with the correlation information achieved in the saturated state, as well as making a correction, when the total amount of electric discharge is smaller than the predetermined threshold value, so as to acquire correlation information formed by mixing at a predetermined ratio the correlation information achieved in the initial state with the correlation information achieved in the saturated state.

Further, the present invention provides a computer-readable recording medium that stores a program for computing a state of charge of a secondary battery. By means of the program, a computer performs the following steps: storing in memory data pertaining to a voltage of the secondary battery and a charge/discharge current; reading from the memory the data pertaining to the voltage and the charge/discharge current by means of a processor and computing an open circuit voltage by means of regression analysis; computing a total amount of electric discharge by means of the processor; comparing the total amount of electric discharge with a predetermined threshold value by means of the processor and correcting correlation information about correlation between the open circuit voltage preliminarily stored in the memory and a state of charge in accordance with a relationship between the total amount of electric discharge and the predetermined threshold value; and computing a state of charge of the secondary battery from the corrected correlation information and the computed open circuit voltage by means of the processor.

According to the present invention, the accuracy of estimation of an SOC can be simply enhanced. Therefore, in a case where a secondary battery is incorporated, as a drive source, into an electric vehicle, such as a hybrid electric vehicle or a pure electric vehicle, and the like, charging/discharging of the secondary battery can be efficiently controlled by use of the SOC estimated with high accuracy.

The invention will be more clearly comprehended by reference to the embodiment provided below. However, the scope of the invention is not limited to the embodiment.

BRIEF DESCRIPTION OF THE DRAWINGS

A preferred embodiment of the present invention will be described in detail by reference to the following drawings, wherein.

DETAILED DESCRIPTION

By reference to the drawings, an embodiment of the present invention will be described hereunder by means of taking a hybrid electric vehicle as an example. Although a hybrid electric vehicle that is one of electric vehicles is exemplified in the present embodiment, the present invention can also be applied to another electrical vehicle equipped with a motor as a drive source.

Figure 1:
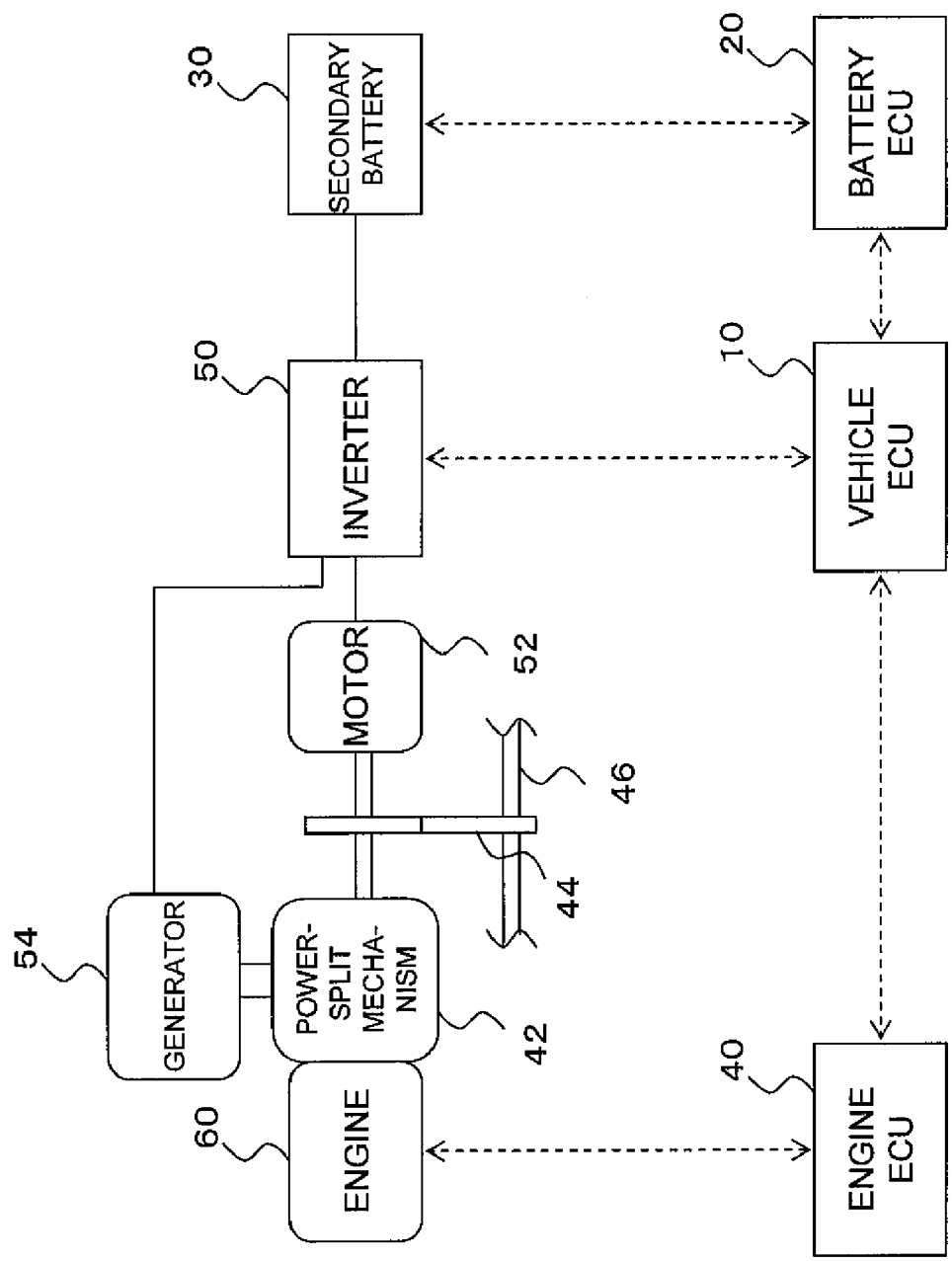
FIG. 1 is an entire schematic diagram of an embodiment of the present invention.

FIG. 1 shows a general configuration of a hybrid electric vehicle of the present embodiment. A vehicle ECU 10 controls an inverter 50 and an engine electronic control unit (engine ECU) 40. The engine ECU 40 controls an engine 60. A battery electronic control unit (battery ECU) 20 receives from a secondary battery 30 information, such as a battery voltage V, a charge/discharge current I, and a battery temperature T, and estimates an SOC of the secondary battery 30 by use of the information. The battery ECU 20 also supplies the vehicle ECU 10 with battery information, such as the SOC and the battery temperature of the secondary battery 30.

The secondary battery 30 supplies power to a motor 52. The inverter 50 converts DC power supplied from the secondary battery 30 during discharging of the secondary battery 30 into AC power, and supplies the AC power to the motor 52.

The engine 60 transmits power to wheels by way of a power-split mechanism 42, a speed reducer 44, and a drive shaft 46. The motor 52 transmits power to the wheels by way of the speed reducer 44 and the drive shaft 46. When recharge is required as a result of a drop in the SOC of the secondary battery 30, a portion of power of the engine 60 is supplied to a generator 54 by way of the power-split mechanism 42 and utilized for charging operation.

On the basis of information about a driving state of the engine 60 from the engine ECU 40; drive information, such as amounts of actuation of an axel pedal, amounts of operation of a brake pedal, and a shift range set by means of a shift lever; and various battery information, such as an SOC from the battery ECU 20, the vehicle ECU 10 outputs a control command to the engine ECU 40 and the inverter 50, thereby driving the engine 60 and the motor 52.

Figure 2:
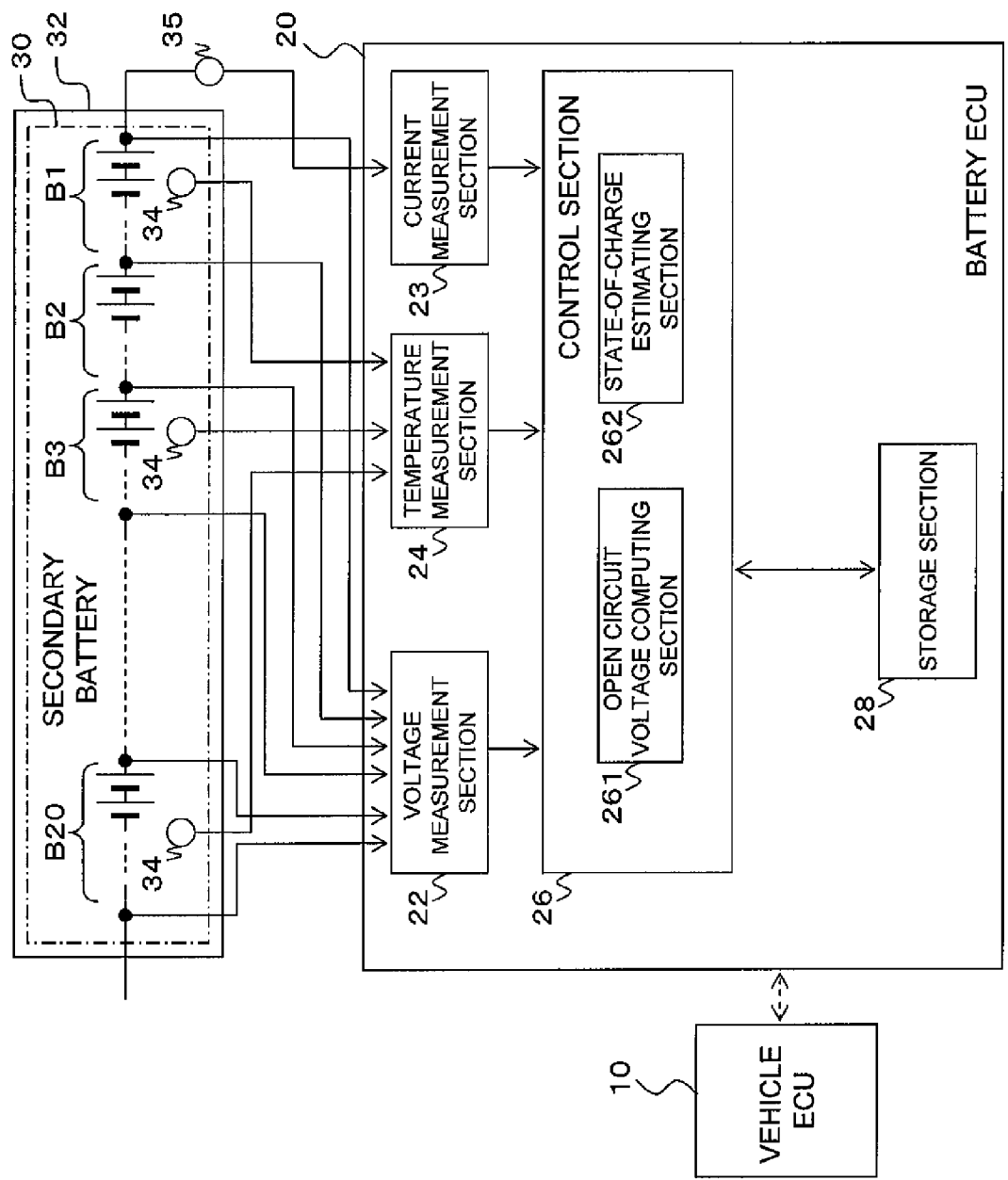
FIG. 2 is a block diagram of a secondary battery and a battery ECU.

FIG. 2 shows the configuration of the secondary battery 30 and the battery ECU 20. The secondary battery 30 is constituted by series connection of battery blocks B1 to B20. The battery blocks B1 to B20 are housed in a battery case 32. Each of the battery blocks B1 to B20 is made by series electrical connection of two battery modules, and each of the battery modules is constituted by series electrical connection of six cells. A nickel-metalhydride battery and a lithium ion battery can be used for each cell. Specific limitations are not imposed on the number of battery modules and cells.

A plurality of temperature sensors 34 are disposed within the battery case 32. The plurality of temperature sensors 34 are arranged by means of: taking a plurality of battery blocks having comparatively-close temperatures as one group or one battery block, which comparatively differs from any battery block in terms of a temperature, as one group; and arranging one temperature sensor 34 for each group. Grouping is also carried out by means of measuring temperatures of the respective battery blocks through preliminary tests, and the like. In the present embodiment, M (M is a natural number) temperature sensors 34 are assumed to be provided, and temperatures measured by the respective temperature sensors 34 are expressed as a temperature T(1), . . . , and a temperature T(M).

The battery ECU 20 has a voltage measurement section 22, a current measurement section 23, a temperature measurement section 24, a control section 26, and a storage section 28. The voltage measurement section 22 measures terminal voltages of the respective battery blocks of the secondary battery 30 and outputs the thus-measured voltages to the control section 26. The control section 26 stores voltage data into the storage section 28. The control section 26 summates the terminal voltages of the respective battery blocks indicated by the voltage data stored in the storage section 28, to thus compute a battery voltage V.

The current measurement section 23 measures a charge/discharge current I achieved during charging/discharging of the secondary battery 30. In the present embodiment, the current measurement section 23 converts an analogue signal output from the current sensor 35 into a digital signal; generates from the digital signal current data for specifying an electric current input to the secondary battery 30 during charging operation and an electric current output from the secondary battery 30 during discharging operation; and outputs the current data to the control section 26. The current measurement section 23 also generates current data by means of taking an electric current acquired during charging operation as a minus current and an electric current acquired during discharging operation as a plus current. The current measurement section 23 outputs the current data to the control section 26 at a preset period (e.g., 100 ms).

The temperature measurement section 24 measures a battery temperature of the secondary battery 30. In the present embodiment, analogue signals output from the respective temperature sensors 34 set for the respective groups are converted into digital signals, and temperature data for specifying battery temperatures of the respective groups are generated from the digital signals. The thus-generated temperature data are output to the control section 26. The control section 26 computes an average of the temperatures T(1) to T(M) indicated by the temperature data, thereby computing the battery temperature T.

The control section 26 is formed from a microprocessor; has as functional blocks an open circuit voltage (OCV) computing section 261 and a state-of-charge (SOC) estimation section 262; and estimates an SOC of the secondary battery 30 from the battery voltage V, the charge/discharge current I, the battery temperature T, and the like. Specifically, the control section 26 computes an OCV from the battery voltage V and the charge/discharge current I; tentatively estimates an SOC from the computed OCV by reference to an OCV-SOC map preliminarily stored in the storage section 28; and makes a correction to the SOC on the basis of the integrated current value, to thus estimate the SOC of the secondary battery 30. Under the method for estimating an SOC by means of only the integrated current, the SOC can be estimated with high accuracy in a short term. However, in a long term, the accuracy of the SOC deteriorates on account of a detection error in the current sensor, fluctuations in charging efficiency, and the like. Moreover, since the OCV-SOC map achieved in the initial state varies under influence of the memory effect as mentioned previously, a correction must be made to the OCV-SOC map in accordance with the memory effect. In the present embodiment, a correction is made to the OCV-SOC map by utilization of the following facts. In the present embodiment, an OCV from which polarization components have previously been eliminated may also be adopted. The polarization components can be determined from an amount of change $\Delta Q$ in an integrated current capacity Q and the battery temperature T which are acquired during a predetermined period. A method for determining polarization components is known and described in; for instance, 2003-197275 A.

A memory effect does not occur in an initial stage of a battery and gradually arises as the battery is used. However, there is a fact that a voltage drop/voltage rise attributable to the memory effect does not come to a certain value or more. There is also another fact that a memory effect becomes saturated in a normal range of the battery temperature T when a total amount of electric discharge ranges from 400 Ah (ampere hour) to 1600 Ah. From these facts, a total amount of electric discharge of the secondary battery 30 is computed; a determination is made as to whether or not the total amount of electric discharge is equal to or greater than a preset threshold voltage; when the total amount of electric discharge exceeds the threshold value, the OCV-SOC map is replaced with a map for use in a case where the memory effect becomes saturated; and, when the total amount of electric discharge is smaller than the preset threshold value, an initial state where no memory effect is produced and a state where the memory effect is saturated are mixed together at a predetermined ratio and a correction is made to the OCV-SOC map to a specific value achieved during a period from the state where no memory effect is produced to the state where the memory effect is saturated. To these ends, an OCV-SOC map achieved in an initial state and an OCV-SOC map achieved when the memory effect is saturated are stored in advance in the storage section 28. The predetermined threshold value is set according to the fact that the memory effect becomes saturated within the range from 400 Ah to 1600 Ah, so as to fall within the range from 400 Ah to 1600 Ah. For instance, the predetermined threshold value is set to 1000 Ah that is an average of the range from 400 Ah to 1600 Ah. Alternatively, the threshold value is set to 400 Ah that is the lower limit value, 1600 Ah that is the upper limit value, and the like. In short, the threshold value is set on the basis of the total amounts of electric discharge that are empirical values at which the memory effect becomes saturated; namely, 400 Ah to 1600 Ah. The threshold value is stored in the storage section 28.

Figure 3:
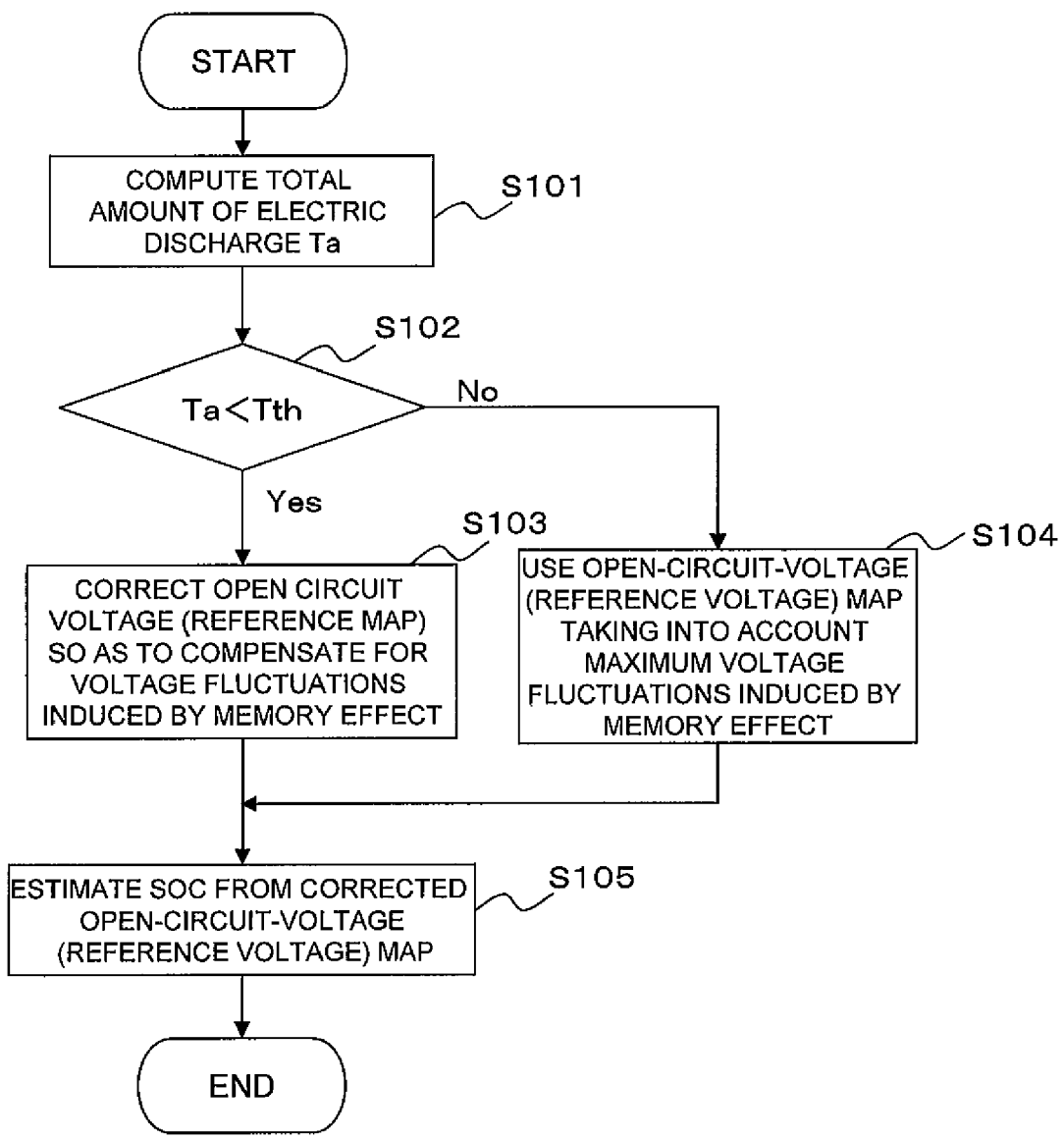
FIG. 3 is a flowchart of processing of the embodiment.

FIG. 3 shows a processing flowchart of estimation of an SOC performed in the battery ECU 20. First, the control section 26 computes a total amount of electric discharge Ta from the current data from the current measurement section 23 (S101). Specifically, the total amount of electric discharge Ta is computed by extracting only an electric current acquired during discharging operation and subjecting the thus-extracted current to time integration. Next, the total amount of electric discharge Ta is compared with the threshold value Tth, to thus determine whether or not there is achieved a relationship of Ta<Tth (S102). The threshold value Tth is set so as to fall within the range from 400 Ah to 1600 Ah as mentioned above. When there stands a relationship of Ta<Tth, a correction is made to the open circuit voltage (OCV) map; namely, the OCV-SOC map, such that voltage variations attributable to the memory effect are compensated (S103). More specifically, a correction is made so as to achieve a map acquired between the map achieved in the initial state and the map achieved in the saturated state of the memory effect. An example of such a correction method is linear interpolation conforming to the total amount of electric discharge Ta, but the method is not limited to linear interpolation. Further detailed descriptions will be provided later for the correction method. When there stands a relationship of Ta$\geqq$Tth, the open circuit voltage (OCV) map taking into account the maximum voltage fluctuations attributable to the memory effect is selected (S104). After an OCV-SOC map is corrected or selected according to the relationship between the total amount of electric discharge Ta and the threshold value Tth, an SOC is estimated from the open circuit voltage map (the OCV-SOC map) (S105). An OCV is computed by the open circuit voltage computing section 261. Specifically, a plurality of pieces of pair data consisting of a battery voltage V and a charge/discharge current I acquired in a predetermined period of time (e.g., 60 seconds) are acquired from the storage section 28. A first-order linear approximation line (an approximation line determined from a voltage V and an electric current I) is determined from the pieces of pair data by means of regression analysis. A V intercept of a V-I approximation line is computed as an open circuit voltage (OCV) An SOC is estimated form the OCV as mentioned above. Further, an SOC may be estimated from an integrated current value, and a final SOC may also be estimated from these estimated values. Processing pertaining to S101 to S105 is implemented by means of the control section 26 reading a program stored in a recording medium, such as ROM, and consecutively executing the thus-read program. The program can be stored in a computer-readable recording medium, such as a CD and a DVD.

Figure 4:
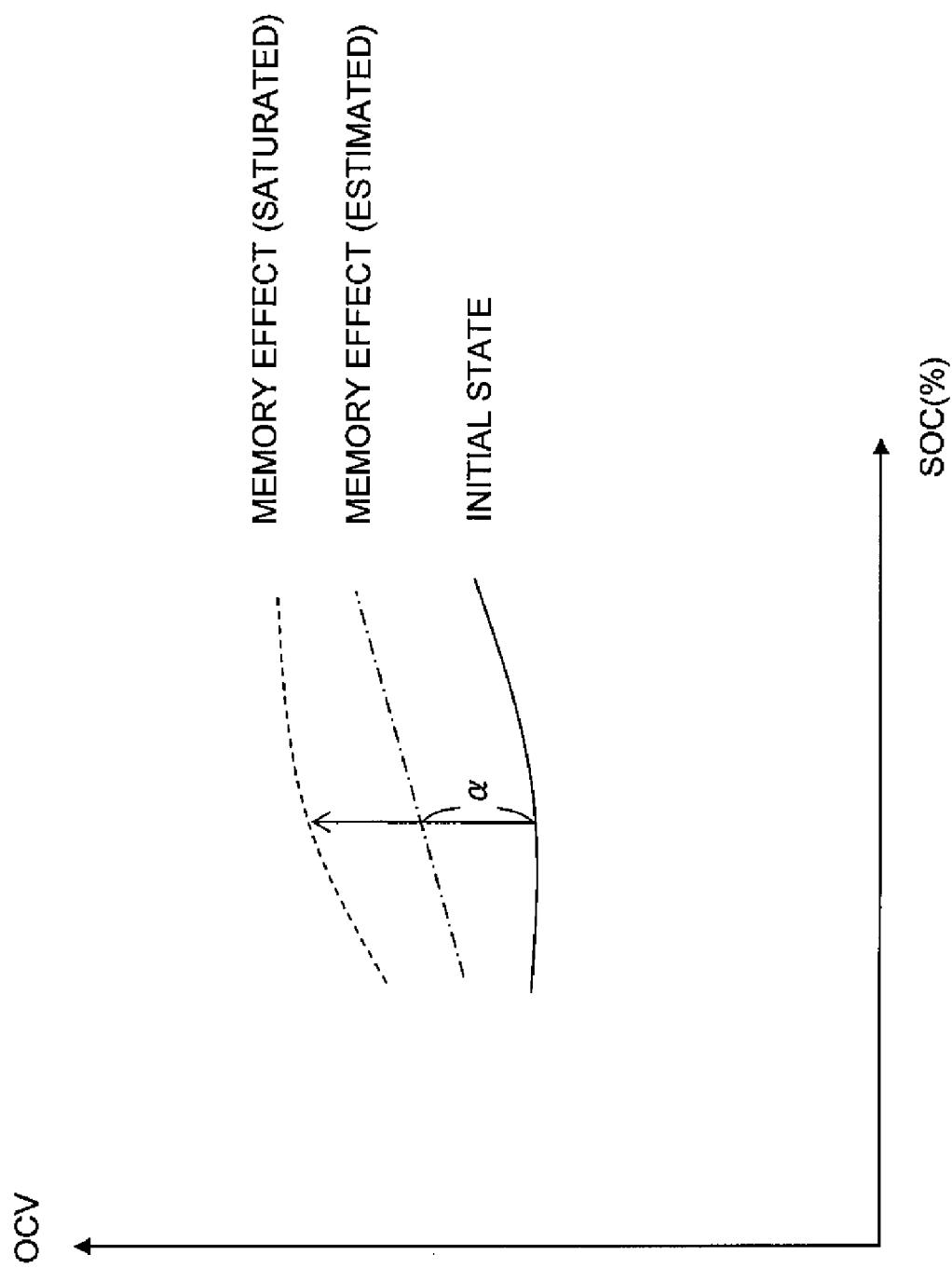
FIG. 4 is an explanatory view of a correction to a map taking into account a memory effect.

As above, in the present embodiment, when the total amount of electric discharge Ta is smaller than the threshold value Tth, an SOC is estimated by use of a map that stands midway between the map achieved in the initial state and the map achieved when the memory effect is saturated. When the total amount of electric discharge Ta becomes equal to or greater than the threshold value Tth, the SOC is estimated by use of the map achieved in a state where the memory effect is saturated. As shown in FIG. 4, the method for correcting the map achieved when the total amount of electric discharge Ta is smaller than the threshold value Tth is to make a correction so as to achieve a value (indicated by a dashed line in the drawing) located midway between a value of the map achieved in the initial state (indicated by a solid line in the drawing) and a value of the map achieved in a state where the memory effect is saturated (indicated by a broken line in the drawing). Given that a ratio coefficient is $\alpha$ ($0 \leqq \alpha \leqq 1$; $\alpha = 0$ corresponds to a value of a map achieved in an initial state; and $\alpha = 1$ corresponds to a value of a map achieved in a state where the memory effect is saturated), the ratio coefficient $\alpha$ is changed as follows in accordance with the total amount of electric discharge Ta. Provided that a map achieved after correction is S, a map achieved in an initial state is Sini, and a map achieved in a saturated state is Ssat, there stands a relationship of $S = (1-\alpha) \cdot Sini + \alpha \cdot Ssat$.

Figure 5:
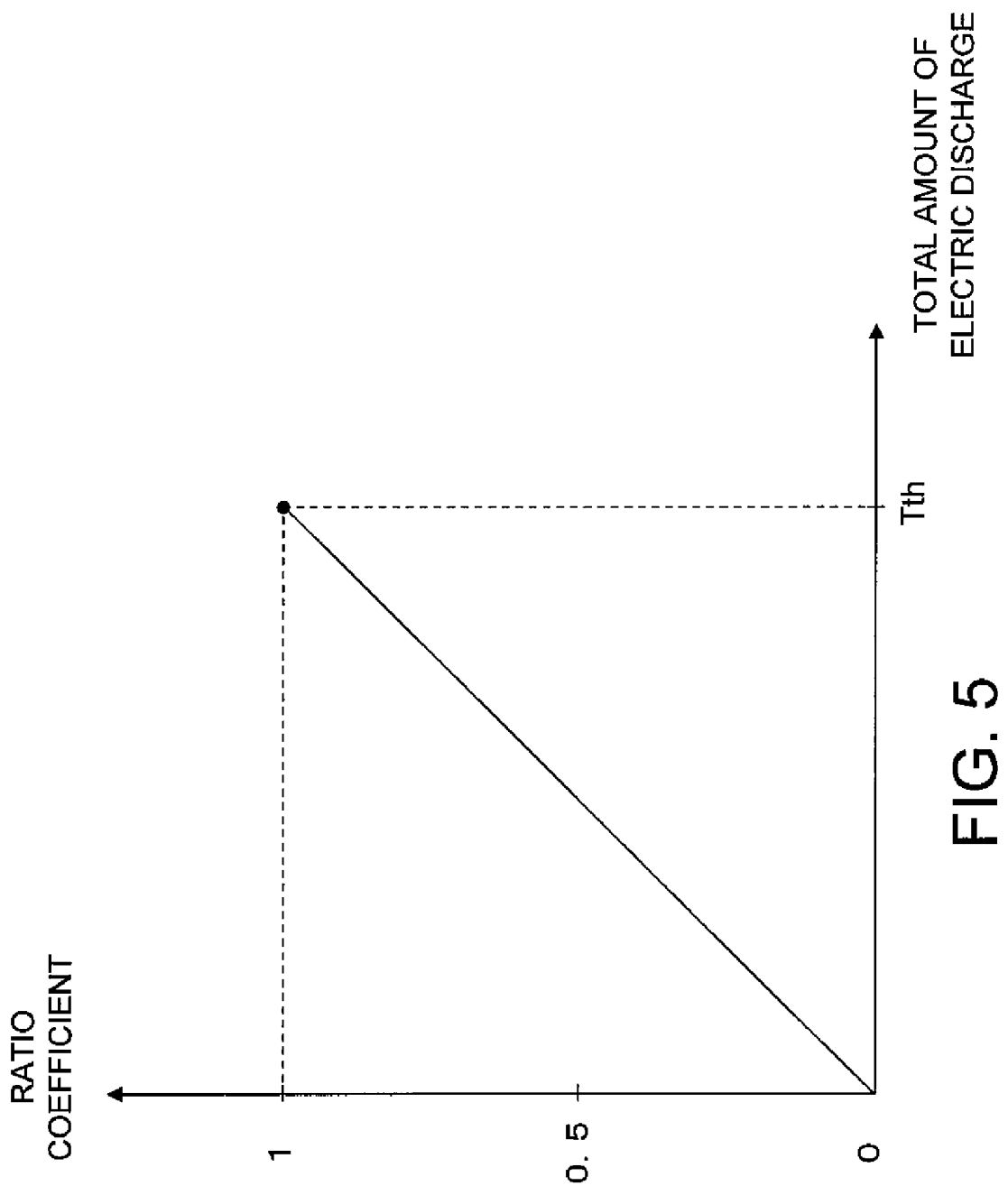
FIG. 5 is a graph (part 1) showing a ratio coefficient.

FIG. 5 shows a case where a correction is made by means of linear interpolation. When the total amount of electric discharge Ta is 0, a ratio coefficient assumes a value of 0 (i.e., the map achieved in an initial state). When the total amount of electric discharge Ta is the threshold value Tth, the ratio coefficient $\alpha$ assumes a value of one (i.e., the map achieved in a saturated state). A linear increase arises between the values. When the total amount of electric discharge Ta is Tth/2, the value of the corrected map stands between the value of the map achieved in the initial state and the value of the map achieved in the saturated state.

Figure 6:
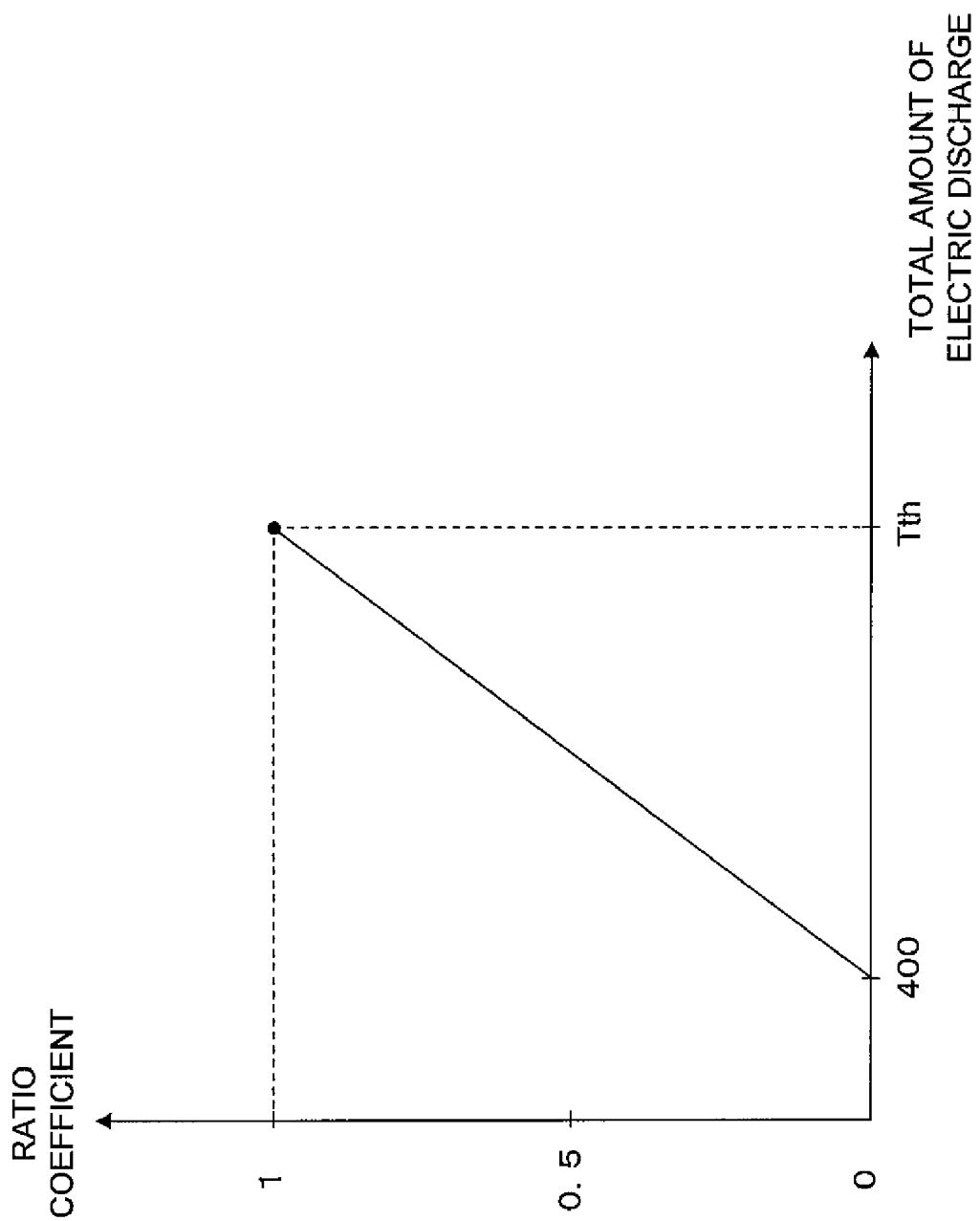
FIG. 6 is a graph (part 2) showing a ratio coefficient.

FIG. 6 shows a case where the ratio coefficient $\alpha$ assumes a value of zero (i.e., the map achieved in the initial state) until the total amount of electric discharge Ta is smaller than the threshold value Tth; for instance, 400 Ah that is the lower limit value in the range from 400 Ah to 1600 Ah and that a linear increase arises when the total amount of electric discharge Ta is equal to or greater than 400 Ah.

Figure 7:
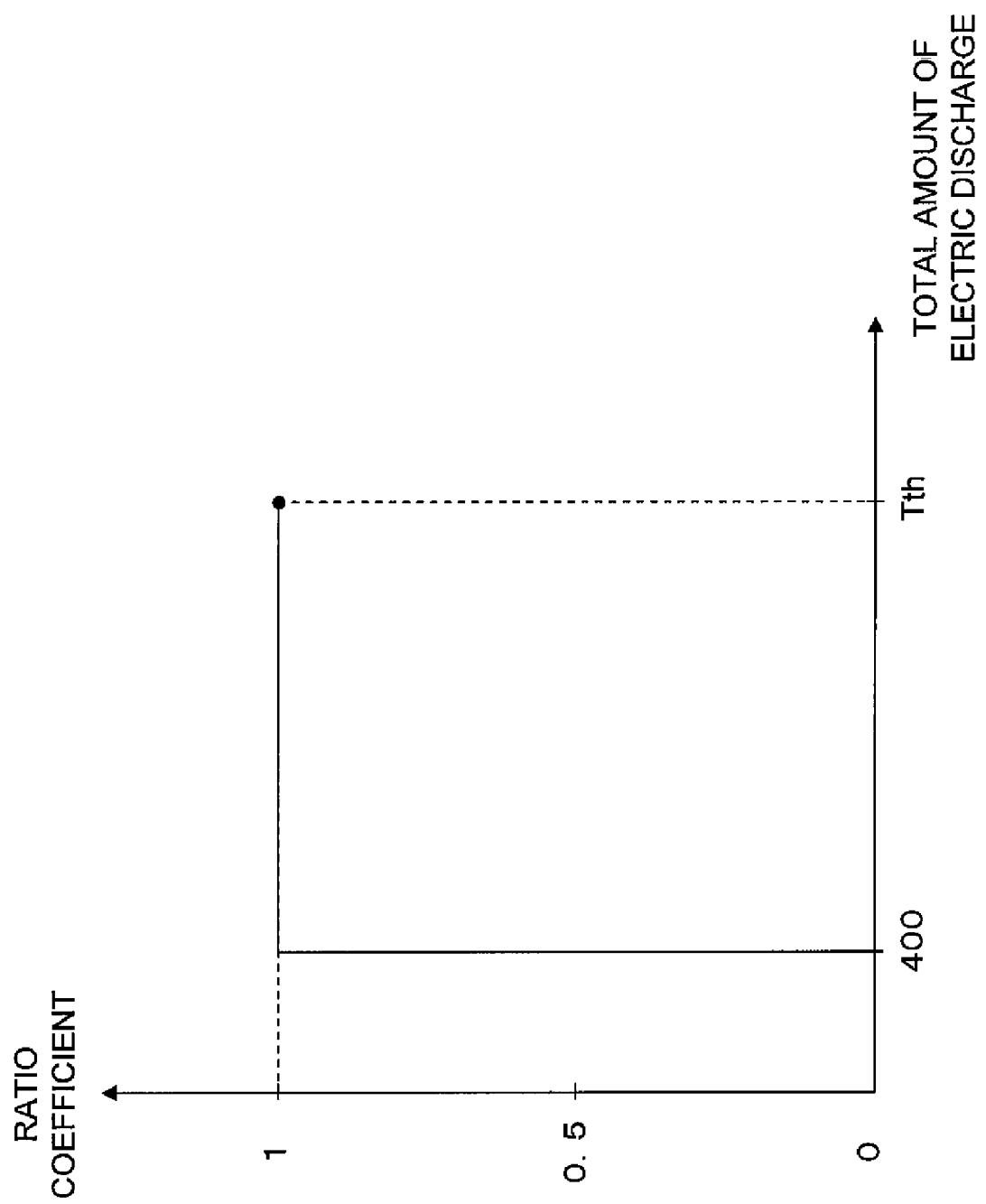
FIG. 7 is a graph (part 3) showing a ratio coefficient.

FIG. 7 shows a case where the ratio coefficient α assumes a value of zero (i.e., the map achieved in the initial state) until the total amount of electric discharge Ta is smaller than the threshold value Tth; for instance, 400 Ah and where, when the total amount of electric discharge Ta is equal to or greater than 400 Ah, the ratio coefficient α assumes a value of one (i.e., the map achieved in the saturated state).

Figure 8:
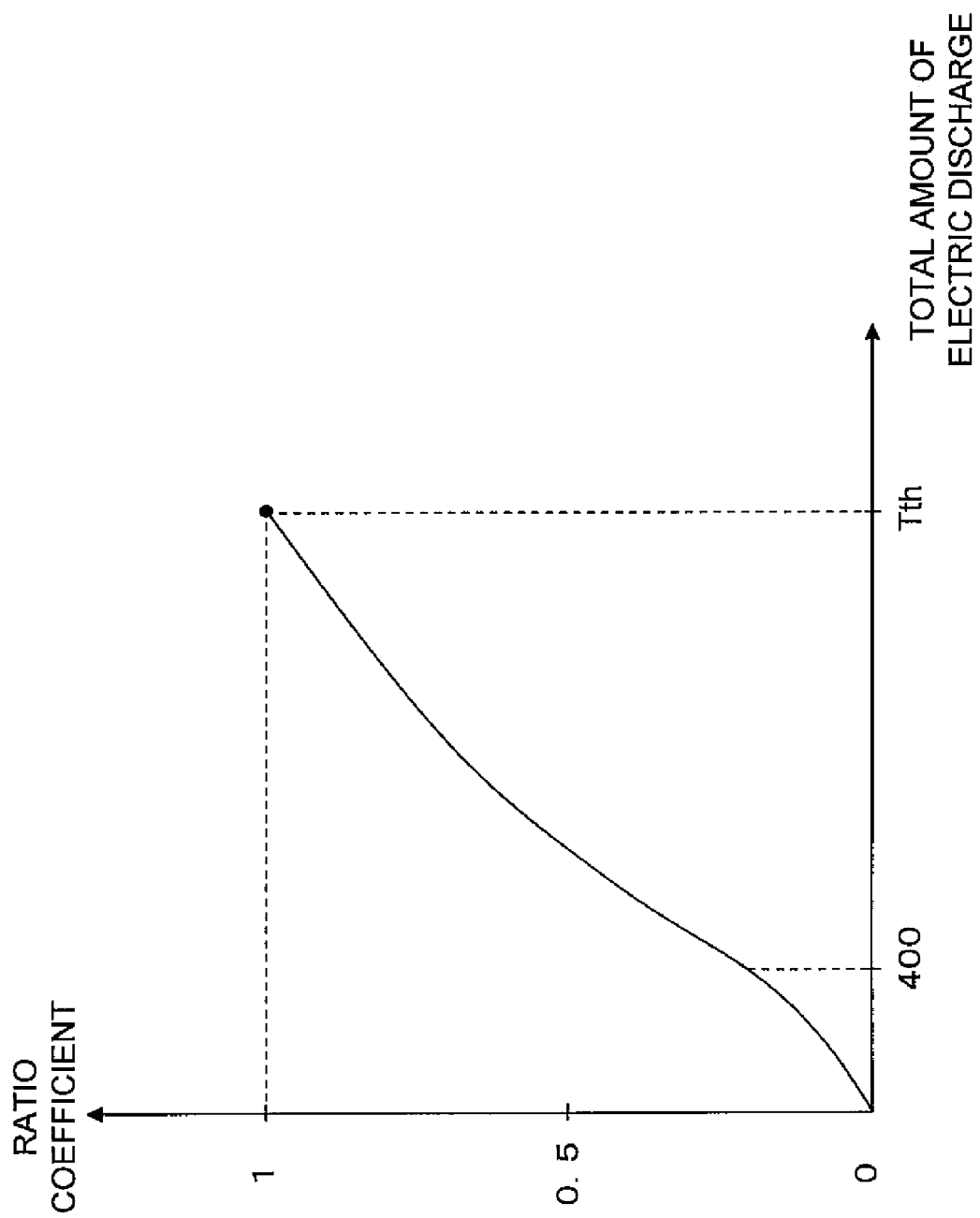
FIG. 8 is a graph (part 4) showing a ratio coefficient.

FIG. 8 shows a correction method employing nonlinear interpolation. The ratio coefficient α increases from zero in conformance to an increase rate (an increase rate exhibiting a convex in a downward direction) until the total amount of electric discharge Ta is smaller than the threshold value; for instance, 400 Ah. When the total amount of electric discharge Ta is equal to or greater than 400 Ah, the ratio coefficient α increases in conformance to an increase rate differing from the increase rate (an increase rate exhibiting a convex in an upward direction).

Figure 9:
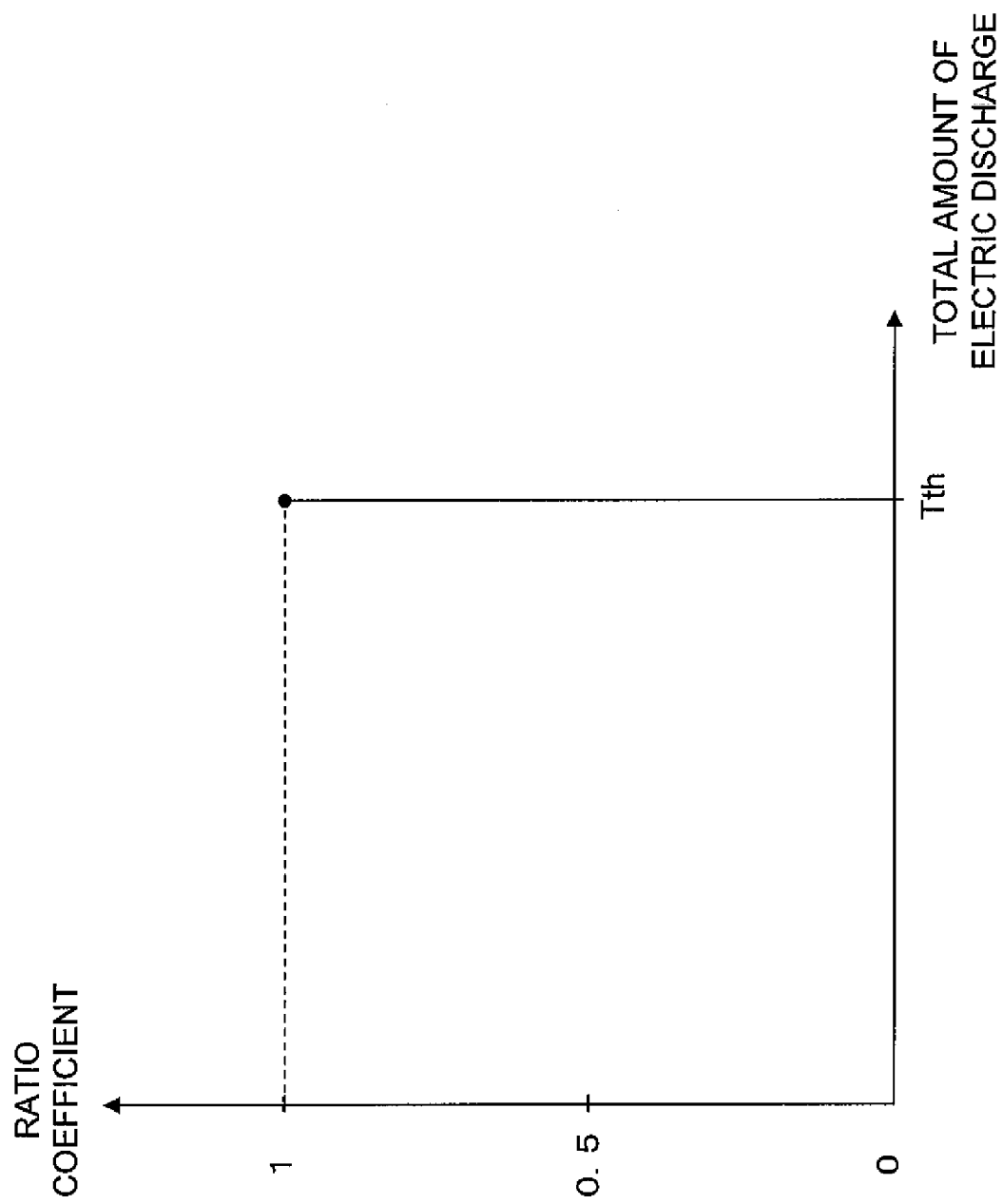
FIG. 9 is a graph (part 5) showing a ratio coefficient.
Figure 10:
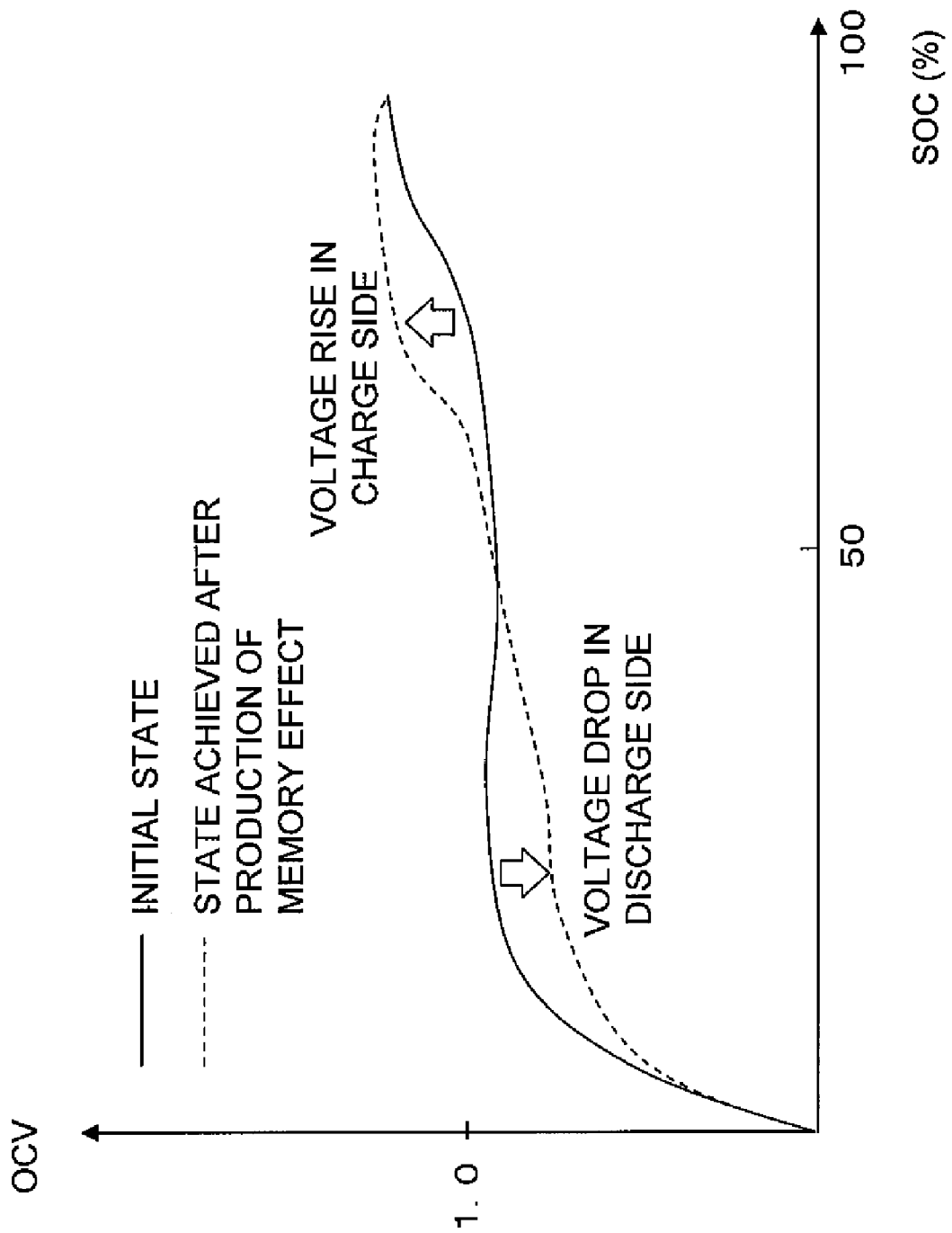
FIG. 10 is an OCV-SOC map achieved in an initial state and after production of a memory effect.

FIG. 9 shows a correction method employing another interpolation. When the total amount of electric discharge Ta is smaller than the threshold value, the ratio coefficient α is zero (i.e., the map achieved in the initial state). When the total amount of electric discharge Ta is equal to or greater than the threshold value, the ratio coefficient α comes to one (i.e., the map achieved in the saturated state).

The correction method of the present embodiment is not limited to those mentioned above, and another correction method may also be adopted; for instance, the case of a correction method employing nonlinear interpolation in which the ratio coefficient α increases from zero to one in accordance with a given increase rate. In general, when the SOC is estimated so as to be higher than an actual SOC, charge/discharge is controlled in accordance with the highly-estimated SOC, and hence an over-charged state is suppressed to a much greater extent. Therefore, from the fail-safe viewpoint, it is preferable to estimate an SOC so as to become higher than an actual SOC, and taking into account the influence of a memory effect in advance is desirable. For these reasons, a smaller threshold value Tth is preferable, and setting the threshold value Tth to the lower limit value of 400 Ah is also possible.

In the present embodiment, the predetermined threshold value falling in the normal temperature range is set, on the basis of an empirical fact, so as to fall within the range from 400 Ah to 1600 Ah. However, the threshold value can vary according to a temperature. Consequently, the threshold value may also be set as a function of a temperature. In general, the threshold value is set so as to become smaller as the temperature increases.

In the present embodiment, a correction is made to the OCV-SOC map in consideration of the relationship between the total amount of electric discharge Ta and the threshold value Tth, to thus estimate an SOC. However, a correction can also be made to the OCV-SOC map by use of a physical quantity or parameter essentially equivalent to the total amount of electric discharge Ta. For instance, each vehicle has an approximately-constant amount of electric discharge per unit travel distance (e.g., 1 Km). Therefore, the total amount of electric discharge can be evaluated by evaluation of the travel distance. A correction may also be made to the OCV-SOC map by comparing the travel distance with the predetermined threshold value. Needless to say, the threshold value achieved in this case is a travel distance that is the equivalent of the amount of electric discharge from 400 Ah to 1600 Ah. When a travel distance is used, it is manifest to those skilled in the art that an index assigned to the horizontal axis in FIGS. 5 through 9 does not represent the total amount of electric discharge but should be read as a travel distance.

Further, in the present embodiment, a total amount of electric discharge of the secondary battery is detected, and a correction is made to correlation information. However, a correction can also be made to correlation information on the basis of a total amount of electric charge or a total amount of electric charge/discharge. However, in this case, the accuracy of correction achieved in this case becomes worse than that achieved in the case of a correction made on the basis of the total amount of electric discharge, and the accuracy of estimation of a charged state becomes deteriorated. The reason for this is that the efficiency of electric discharge remains essentially stable at a value of one but the efficiency of charge varies in accordance with a charged state or a temperature.

What is claimed is:

1. An apparatus for estimating a state of charge of a secondary battery, comprising:
   a storage unit that stores correlation information showing correlation between an open circuit voltage and a state of charge;
   a total-amount-of-electric-discharge detection unit that detects a total amount of electric discharge of the secondary battery;
   a correction unit that makes a correction to the correlation information in accordance with a relationship between the total amount of electric discharge and a predetermined threshold value; and
   an estimation unit that estimates a state of charge of the secondary battery by use of the corrected correlation information,
   wherein the storage unit stores, as the correlation information, correlation information achieved in an initial state where no memory effect is produced and correlation information achieved in a saturated state where the memory effect is saturated; and
   the correction unit makes a correction, when the total amount of electric discharge is equal to or greater than the predetermined threshold value, so as to replace the correlation information achieved in the initial state with the correlation information achieved in the saturated state, as well as making a correction, when the total amount of electric discharge is smaller than the predetermined threshold value, so as to acquire correlation information formed by mixing at a predetermined ratio the correlation information achieved in the initial state with the correlation information achieved in the saturated state.

2. The apparatus according to claim 1, wherein the predetermined threshold value is set to any value falling within a range from 400 Ah to 1600 Ah.

3. The apparatus according to claim 1, wherein, when the total amount of electric discharge is smaller than the predetermined threshold value, the correction unit makes a correction so as to acquire correlation information acquired by means of subjecting the correlation information achieved in the initial state and the correlation information achieved in the saturated state to linear interpolation according to the total amount of electric discharge.

4. The apparatus according to claim 1, wherein, when the total amount of electric discharge is smaller than the predetermined threshold value, the correction unit makes a correction so as to acquire correlation information acquired by means of subjecting the correlation information achieved in the initial state and the correlation information achieved in the saturated state to nonlinear interpolation according to the total amount of electric discharge.

5. The apparatus according to claim 1, wherein, when the total amount of electric discharge is smaller than the predetermined threshold value, the correction unit makes a correction so as to acquire the correlation information achieved in the initial state until the total amount of electric discharge comes to 400 Ah and to acquire correlation information, which is obtained by means of subjecting the correlation information achieved in the initial state and the correlation information achieved in the saturated state to linear interpolation in accordance with the total amount of electric discharge, until the total amount of electric discharge falls within a range from 400 Ah to the predetermined threshold value.

6. The apparatus according to claim 1, wherein, when the total amount of electric discharge is smaller than the predetermined threshold value, the correction unit makes a correction so as to acquire the correlation information achieved in the initial state until the total amount of electric discharge comes to 400 Ah and to replace the correlation information with the correlation information achieved in the saturated state until the total amount of electric discharge falls within a range from 400 Ah to the predetermined threshold value.

7. The apparatus according to claim 1, wherein, when the total amount of electric discharge is smaller than the predetermined threshold value, the correction means acquires the correlation information achieved in the initial state.

8. A computer-readable recording medium that stores a program for computing a state of charge of a secondary battery, wherein by means of the program a computer performs the following steps:
storing in memory data pertaining to a voltage of the secondary battery and a charge/discharge current;
reading from the memory the data pertaining to the voltage and the charge/discharge current by means of a processor and computing an open circuit voltage by means of regression analysis;
computing a total amount of electric discharge by means of the processor;
comparing the total amount of electric discharge with a predetermined threshold value by means of the processor and correcting correlation information about correlation between the open circuit voltage preliminarily stored in the memory and a state of charge in accordance with a relationship between the total amount of electric discharge and the predetermined threshold value; and
computing a state of charge of the secondary battery from the corrected correlation information and the computed open circuit voltage by means of the processor,
wherein the memory stores, as the correlation information, correlation information about an initial state where no memory effect is produced and correlation information about a saturated state where the memory effect is saturated; and
the processor makes a correction so as to replace the correlation information about the initial state with the correlation information about the saturated state when the total amount of electric discharge is equal to or greater than the predetermined threshold value, and makes a correction so as to acquire correlation information achieved by mixing at a predetermined ratio the correlation information about the initial state with the correlation information about the saturated state when the total amount of electric discharge is smaller than the predetermined threshold value.

9. An apparatus for estimating a state of charge of a secondary battery provided in a vehicle, comprising:
a storage unit that stores correlation information showing correlation between an open circuit voltage and a state of charge;
a travel distance detection unit that detects a travel distance of the vehicle;
a correction unit that makes a correction to the correlation information in accordance with a relationship between the travel distance and the predetermined threshold value; and
an estimation unit that estimates a state of charge of the secondary battery by use of the corrected correlation information,
wherein the storage unit stores, as the correlation information, correlation information about an initial state where no memory effect is produced and correlation information about a saturated state where the memory effect is saturated;
the correction unit makes a correction so as to replace the correlation information about the initial state with the correlation information about the saturated state when the travel distance is equal to or greater than the predetermined threshold value, and makes a correction so as to acquire correlation information obtained by mixing at a predetermined ratio the correlation information about the initial state with the correlation information about the saturated state when the travel distance is smaller than the predetermined threshold value.

* * * * *